US010930768B2

(12) United States Patent
Hong et al.

(10) Patent No.: US 10,930,768 B2
(45) Date of Patent: Feb. 23, 2021

(54) LOW CURRENT LEAKAGE FINFET AND METHODS OF MAKING THE SAME

(71) Applicant: Samsung Electronics Co., Ltd., Suwon-si (KR)

(72) Inventors: Joon Goo Hong, Austin, TX (US); Borna J. Obradovic, Leander, TX (US); Kang-ill Seo, Springfield, VA (US); Mark Stephen Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/282,048

(22) Filed: Feb. 21, 2019

(65) Prior Publication Data

US 2020/0127125 A1 Apr. 23, 2020

Related U.S. Application Data

(60) Provisional application No. 62/747,608, filed on Oct. 18, 2018.

(51) Int. Cl.
*H01L 29/66* (2006.01)
*H01L 29/417* (2006.01)
(Continued)

(52) U.S. Cl.
CPC .............. *H01L 29/66818* (2013.01); *H01L 21/823412* (2013.01); *H01L 21/823431* (2013.01); *H01L 29/41791* (2013.01); *H01L 29/78* (2013.01)

(58) Field of Classification Search
CPC ......... H01L 29/66818; H01L 29/41791; H01L 21/823412; H01L 21/823431; H01L 29/78;
(Continued)

(56) References Cited

U.S. PATENT DOCUMENTS

| 7,087,471 B2 | 8/2006 | Beintner |
| 8,716,786 B2 | 5/2014 | Baumgartner et al. |

(Continued)

FOREIGN PATENT DOCUMENTS

WO 2017171845 A1 10/2017

OTHER PUBLICATIONS

Rambouw, Freddy T., et al., "Excited-State Dynamics in Colloidal Semiconductor Nanocrystals," Topics in Current Chemistry, 2016, vol. 374, 30 pages.
(Continued)

*Primary Examiner* — Robert G Bachner
(74) *Attorney, Agent, or Firm* — Lewis Roca Rothgerber Christie LLP

(57) ABSTRACT

A method of manufacturing a field effect transistor includes forming a fin on a substrate, forming source and drain electrodes on opposite sides of the fin, forming a gate stack on a channel portion of the fin between the source and drain electrodes, forming gate spacers on extension portions of the fin on opposite sides of the gate stack, removing at least a portion of the gate spacers to expose the extension portions of the fin, and thinning the extension portions of the fin. Following the thinning of the extension portions of the fin, the channel portion of the fin has a first width and the extension portions of the fin have a second width less than the first width.

21 Claims, 9 Drawing Sheets

(51) Int. Cl.
*H01L 21/8234* (2006.01)
*H01L 29/78* (2006.01)

(58) Field of Classification Search
CPC ............ H01L 29/66795; H01L 29/785; H01L 29/66545; H01L 27/088
See application file for complete search history.

(56) References Cited

U.S. PATENT DOCUMENTS

| | | | |
|---|---|---|---|
| 9,263,554 B2 | 2/2016 | Basker et al. | |
| 9,390,977 B2 | 7/2016 | Han et al. | |
| 9,466,669 B2 | 10/2016 | Rodder et al. | |
| 9,679,775 B2 | 6/2017 | Chan et al. | |
| 9,779,996 B2 | 10/2017 | Kim et al. | |
| 9,812,575 B1 | 11/2017 | Reznicek et al. | |
| 10,056,486 B2 | 8/2018 | Pandey et al. | |
| 2005/0026333 A1 | 2/2005 | Hareland et al. | |
| 2005/0051825 A1* | 3/2005 | Fujiwara ........... | H01L 29/66545 257/308 |
| 2005/0239242 A1* | 10/2005 | Zhu ...................... | H01L 29/785 438/199 |
| 2007/0069254 A1 | 3/2007 | Cho et al. | |
| 2007/0210355 A1 | 9/2007 | Izumida | |
| 2016/0086943 A1 | 3/2016 | Lee et al. | |
| 2016/0172358 A1* | 6/2016 | Hatcher ............... | H01L 29/775 257/401 |
| 2016/0315014 A1 | 10/2016 | Chou et al. | |
| 2017/0054027 A1 | 2/2017 | Liu | |
| 2017/0358577 A1 | 12/2017 | Lin et al. | |
| 2018/0053693 A1 | 2/2018 | Cheng et al. | |

OTHER PUBLICATIONS

U.S. Final Office Action dated Oct. 13, 2020, issued in U.S. Appl. No. 16/282,105 (15 pages).
Office Action issued in U.S. Appl. No. 16/282,105 by the USPTO, dated Aug. 5, 2020, 17 pages.
Office Action Interview Summary issued in U.S. Appl. No. 16/282,105 by the USPTO, dated Sep. 25, 2020, 8 pages.
Saitoh, M., et al., Short-Channel Performance and Mobility Analysis of <110>- and <100>-Oriented Tri-Gate Nanowire MOSFETs with Raised Source/Drain Extensions, 2010 Symposium on VLSI Technology, Aug. 23, 2010, pp. 169-170, Honolulu, Hawaii.

* cited by examiner

LOW CURRENT LEAKAGE FINFET AND METHODS OF MAKING THE SAME

CROSS-REFERENCE TO RELATED APPLICATION(S)

This application claims priority to and the benefit of U.S. Provisional Application No. 62/747,608, filed Oct. 18, 2018, the entire contents of which are incorporated herein by reference.

FIELD

The present disclosure relates generally to field effect transistors and methods of making the same.

BACKGROUND

Related art field effect transistors (FETs) typically achieve lower source-drain leakage current by increasing the length of the gate (i.e., Wimpy devices typically have a longer gate length than a regular FET). Additionally, Wimpy devices are typically formed either by direct printing or a self-aligned-double-patterning (SADP) process with multiple dielectric spacer patterning. Before SADP was utilized, direct printing with intentional lithographical margin was used to pattern the regular and Wimpy devices at the same time. To make the Wimpy device at the 7NM generation and beyond, SADP or extreme ultraviolet (EUV) direct printing lithography is utilized in general. However, forming a Wimpy device by direct printing (e.g., variable gate critical dimension (CD) patterning with a single exposure) can result in a gate length variation penalty, and forming a Wimpy device by an SADP process requires additional lithography steps (e.g., additional dielectric deposition and etch steps). That is, more process variation, such as gate length variation, is expected from the tight direct printing with a single mask, and additional patterning process steps are required for the SADP process of forming the Wimpy devices.

SUMMARY

The present disclosure is directed to various embodiments of a method of manufacturing a field effect transistor. In one embodiment, the method includes forming a fin on a substrate, forming source and drain electrodes on opposite sides of the fin, forming a gate stack on a channel portion of the fin between the source and drain electrodes, forming gate spacers on extension portions of the fin on opposite sides of the gate stack, removing at least a portion of the gate spacers to expose the extension portions of the fin, and thinning the extension portions of the fin. The channel portion of the fin has a first width and the extension portions of the fin have a second width less than the first width following the thinning of the extension portions of the fin.

Thinning the extension portions may include etching the extension portions of the fin with a wet etch or a dry etch.

The method may also include depositing a dielectric material on the extension portions of the fin after the thinning of the extension portions of the fin.

The dielectric material comprises an insulative material such as Silicon Oxide, Silicon Nitride, Silicon Carbon Oxide, Silicon Boron Carbon Nitride, Silicon Carbon Nitride, air, or combinations thereof.

The second width of the extension portions of the fin may be in a range from approximately 2 nm to approximately 5 nm.

The second width may be less than the first width by an amount in a range from approximately 2 nm to approximately 8 nm.

The method may also include additional doping of the extension portions of the fin.

The additional doping may be performed with a Boron and Phosphorous family dopant.

The additional doping may have a dopant concentration in range of approximately 1E18 $cm^{-3}$ to approximately 1E21 $cm^{-3}$.

The present disclosure is also directed to various embodiments of a field effect transistor. In one embodiment, the field effect transistor includes a fin including silicon, a source electrode and a drain electrode on opposite sides of the fin, a gate stack on a channel portion of the fin, and gate spacers on extension portions of the fin. The channel portion of the fin has a first width and the extension portions of the fin have a second width less than the first width.

The second width may be in a range from approximately 2 nm to approximately 5 nm.

The second width may be thinner than the first width by an amount in a range from approximately 2 nm to approximately 8 nm.

The first width may be in a range from approximately 6 nm to approximately 7 nm.

The gate spacers may include an insulative material such as Silicon Oxide, Silicon Nitride, Silicon Carbon Oxide, Silicon Boron Carbon Nitride, Silicon Carbon Nitride, air, or combinations thereof.

The fin may include an n-type dopant or a p-type dopant.

The present disclosure is also directed to various embodiments of a system on chip. In one embodiment, the system on chip includes a first field effect transistor and a second field effect transistor. The first and second field effect transistors each include a fin including silicon, a source electrode and a drain electrode on opposite sides of the fin, a gate stack on a channel portion of the fin, and gate spacers on extension portions of the fin. The channel portion of the fin has a first width and the extension portions of the fin have a second width less than the first width.

The first field effect transistor may be an nFET and the second field effect transistor may be a pFET.

The second width of extension portions the first field effect transistor may be different than the second width of the extension portions of the second field effect transistor.

The second width of the extension portions of the first field effect transistor may be substantially the same as the second width of the extension portions of the second field effect transistor.

For at least one of the first and second field effect transistors, the second width may be in a range from approximately 2 nm to approximately 5 nm.

For at least one of the first and second field effect transistors, the gate spacers may include an insulative material such as Silicon Oxide, Silicon Nitride, Silicon Carbon Oxide, Silicon Boron Carbon Nitride, Silicon Carbon Nitride, air, or combinations thereof.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and advantages of embodiments of the present disclosure will be better understood by reference to the following detailed description when considered in conjunction with the accompanying figures. In the figures, like reference numerals are used throughout the figures to reference like features and components. The figures are not necessarily drawn to scale.

DETAILED DESCRIPTION

Figure 1A:
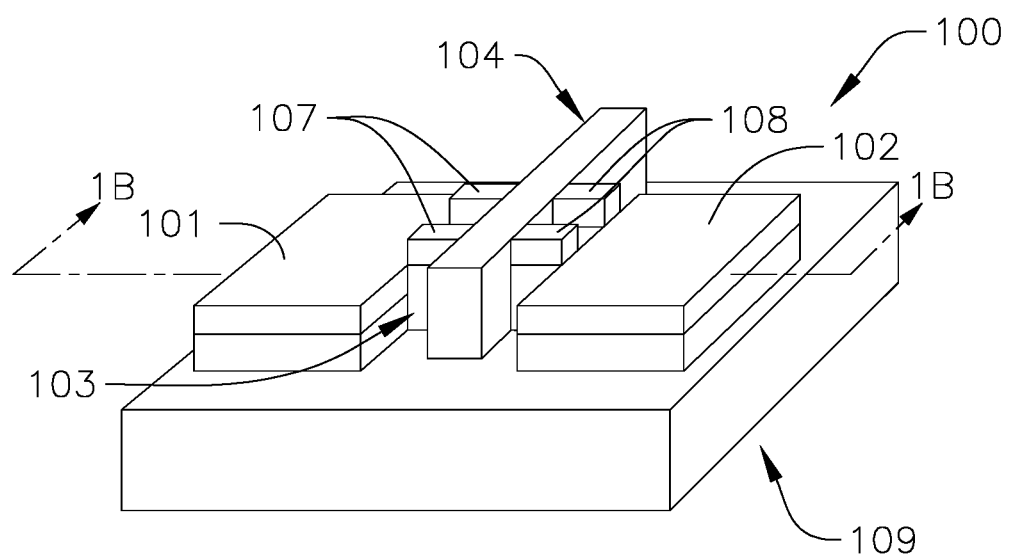
FIGS. 1A-1D are a perspective view and cross-sectional views, respectively, of a field effect transistor according to one embodiment of the present disclosure.
Figure 1B:
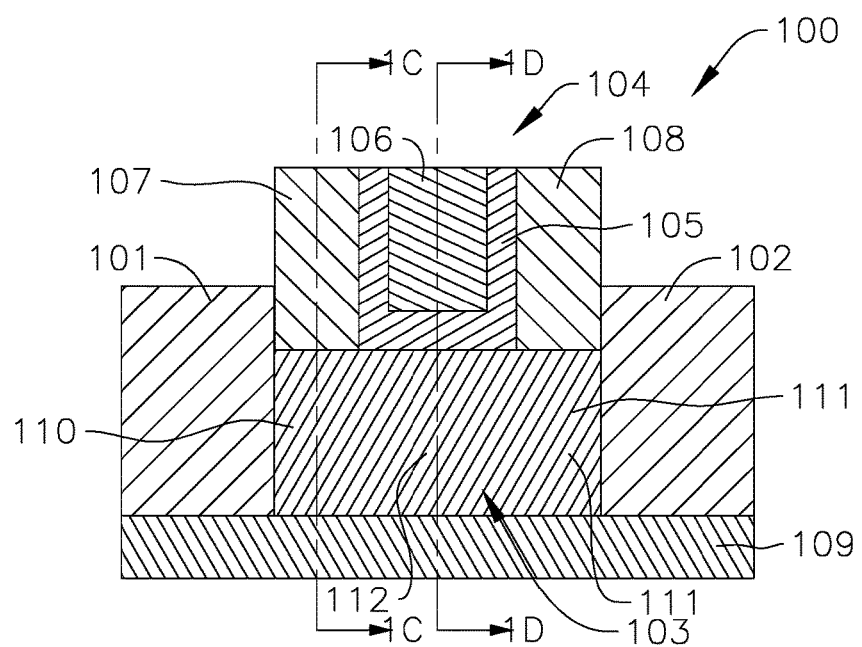
Figure 1C:
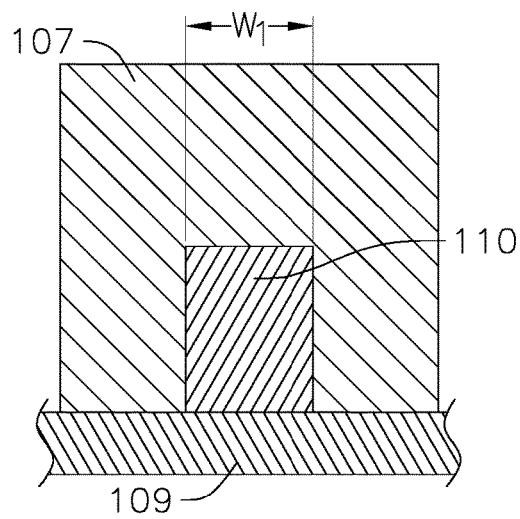
Figure 1D:
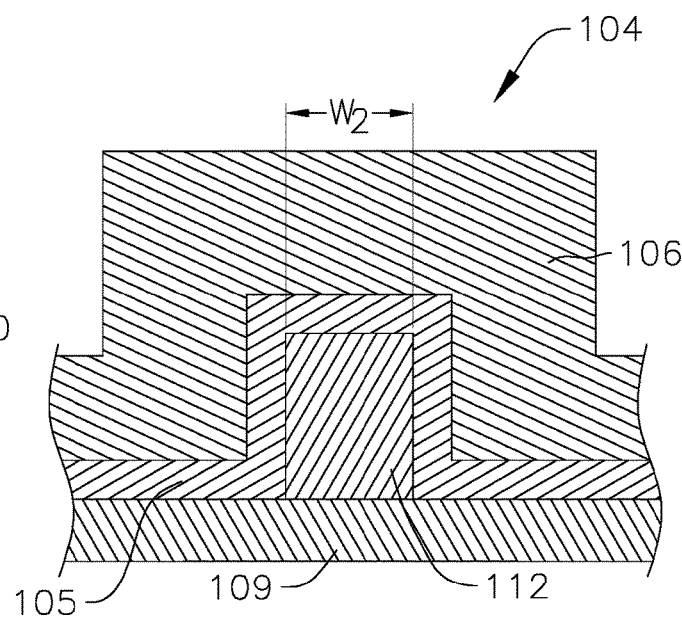

The present disclosure is directed to various embodiments of a fin field effect transistor (finFET) exhibiting reduced source-drain leakage current compared to conventional finFETs, and methods of manufacturing finFETs exhibiting reduced source-drain leakage current. In one or more embodiments of the present disclosure, the finFETs are manufactured by thinning the extension regions of the fin, which decreases the source-drain leakage current of the finFET due to the quantum confinement effect. Additionally, the method of manufacturing the finFET according to one or more embodiments of the present disclosure avoids the additional lithography steps associated with forming a related art finFET by a self-aligned-double-patterning (SADP) process, and avoids the gate length variation penalty associated with forming a related art finFET by a direct printing process. Accordingly, the method of manufacturing the finFET according to one or more embodiments of the present disclosure will not affect gate critical dimension (CD) variation from a single exposure or increase process complexity from the additional patterning for SADP.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

With reference now to FIGS. 1A-1D, a field effect transistor (FET) 100 according to one embodiment of the present disclosure includes a source electrode 101, a drain electrode 102, at least one fin 103 extending between the source and drain electrodes 101, 102, a gate stack 104 including a gate dielectric layer 105 and a metal layer 106 on the dielectric layer 105, and gate spacers 107, 108 along sides of the gate stack 104. The source and drain electrodes 101, 102, the at least one fin 103, and the gate stack 104 are formed on a substrate 109 (e.g., a bulk-silicon substrate or a silicon-on-insulator (SOI) substrate).

In the illustrated embodiment, extension portions 110, 111 of the fin 103 underneath the gate spacers 107, 108, respectively, are thinner than a channel portion 112 of the fin 103 underneath the gate stack 104. In one or more embodiments, the extension portions 110, 111 of the fin 103 have a width $W_1$ less than approximately 10 nm. In one or more embodiments, the extension portions 110, 111 of the fin 103 each have a width $W_1$ in a range from approximately 2 nm to approximately 5 nm. In one or more embodiments, the extension portions 110, 111 of the fin 103 are thinner than the channel portion 112 of the fin 103 by an amount in a range from approximately 2 nm to approximately 8 nm (i.e., the width $W_1$ of each extension portion 110, 111 of the fin 103 is less than the width $W_2$ of the channel portion 112 of the fin 103 by an amount in a range from approximately 2 nm to approximately 8 nm). In one or more embodiments, the width $W_2$ of the channel portion 112 of the fin 103 is less than approximately 10 nm, such as, for example, in a range from approximately 6 nm to approximately 7 nm. The thinner width $W_1$ of the extension portions 110, 111 of the fin 103 relative to the channel portion 112 of the fin 103 is configured to decrease source-drain leakage current due to the quantum confinement effect, compared to a related art FETs in which the width of the fin is constant. In one or more embodiments, the source-drain leakage current of the FET 100 may be reduced, relative to a related art FET in which the extension portions of the fin are not thinned, by a factor in a range from approximately 1× to approximately 10× (e.g., in a range from approximately 1× to approximately 5×). Additionally, in one or more embodiments, extension-channel junctions may be located in the thinned extension portions 110, 111 of the fin 103. Thinning the extension portions 110, 111 of the fin 103 and locating the extension-channel junctions in the thinned extension portions 110, 111 is configured to increase the threshold voltage (Vt) of the FET 100 compared to a related art FET. In one or more embodiments, thinning the extension portions 110, 111 of the fin 103 and locating the extension-channel junctions in the thinned extension portions 110, 111 is configured to increase the threshold voltage (Vt) of the FET 100 by an amount up to approximately 50 mV or up to approximately 100 mV relative to a related art FET without thinned extension portions.

In one or more embodiments, the FET 100 may be an nFET or a pFET (e.g., the fin 103 of the FET 100 may be doped with a p-type dopant, a substantially p-type dopant, an n-type dopant, or substantially an n-type dopant). Additionally, in one or more embodiments, the extension portions 110, 111 of the fin 103 may be doped with a Boron and Phosphorus family dopant. In one or more embodiments, the dopant concentration in the extension portions 110, 111 of the fin 103 may be in range of approximately $1E22\ cm^{-3}$ to approximately $1E16\ cm^{-3}$. In one or more embodiments in which the FET 100 is an n-type FET, the material of the fin 103 may be Group III-V materials, such as InGaAs. In one or more embodiments, the material of the fin 103 may be Group IV materials, such as Ge, for either n-type FETs or p-type FETs. In one or more embodiments in which the FET 100 is a p-type FET, the material of the fin 103 may be Group IV materials, such as SiGe. In one or more embodiments, the fin 103 may be formed of SiGe, with Ge provided in an amount up to approximately 30%.

Additionally, in the illustrated embodiment, the gate spacers 107, 108 include an insulative material (e.g., a dielectric), such as, for example, Silicon Oxide, Silicon Nitride, Silicon Carbon Oxide, Silicon Boron Carbon Nitride, Silicon Carbon Nitride, or combinations thereof. In one or more embodiments, the insulative material of the gate spacers 107, 108 may include air (e.g., the gate spacers 107, 108 may be gate airgap spacers). Furthermore, in one or more embodiments, each of the gate spacers 107, 108 may have a thickness in a range from approximately 4 nm to approximately 15 nm. In one or more embodiments, the thicknesses of the gate spacers 107, 108 may be equal or substantially equal to the lengths of the extension portions 110, 111 of the fin 103.

The present disclosure is also directed to various embodiments of a system on chip (SoC) including a series of finFETs. In one embodiment, the SoC includes at least one finFET 100 illustrated in FIGS. 1A-1B. In one or more embodiments, the finFET 100 of the SoC may be an nFET or a pFET. In one or more embodiments, the SoC may include both a pFET 100 and a nFET 100 (e.g., the SoC may be a CMOS chip). In one or more embodiments, the chip may include a pFET and an nFET having the same or substantially the same widths of the extension portions of the fin (e.g., the extension portions of the pFET and the nFET may be thinned by the same amount). In one or more embodiments, the chip may include a pFET and an nFET having different widths of the extension portions of the fin (e.g., the extension portions of the fin in the pFET may be thinned by a different amount than the extension portions of the fin in the nFET). In one or more embodiments, only those finFETs within a particular location or within particular locations of the chip may include thinned extension portions (e.g., only FETs within one or more regions of the chip may include thinner extension portions relative to the channel portion of the respective fin) to decrease the source-drain leakage current of the FETs only within those one or more desired locations of the chip. In one or more embodiments, all of the FETs of the chip may include thinned extension portions relative to the channel portion of the respective fin (e.g., all of the FETs of the chip may include thinner extension portions relative to the channel portion of the fin) to decrease source-drain leakage current of all of the FETs of the chip. In one or more embodiments, the chip may include at least two pFETs and the width of the extension portions of a first pFET may be the same as or different than the width of the extension portions of a second pFET. In one or more embodiments, the chip may include at least two nFETs and widths of the extension portions of a first nFET may be the same as or different than the width of the extension portions of a second nFET. In one or more embodiments, the widths of the extension portions of the FETs may be different in different regions or portions of the chip (e.g., the widths of the extension portions of the FETs may vary according to the region or portion of the chip in which the FET is located).

Figure 2A:
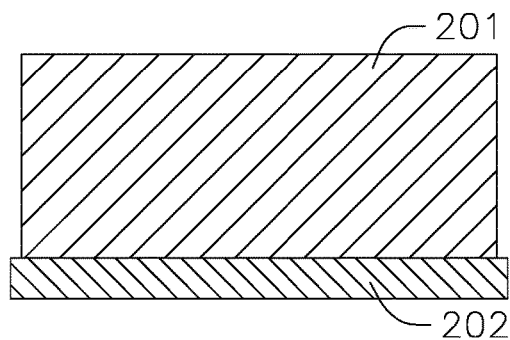
FIGS. 2A-2T depict tasks of a method of forming a field effect transistor according to one embodiment of the present disclosure.
Figure 2B:
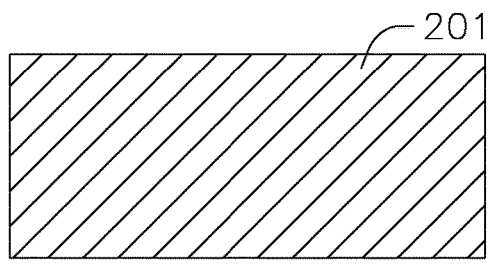
Figure 2C:
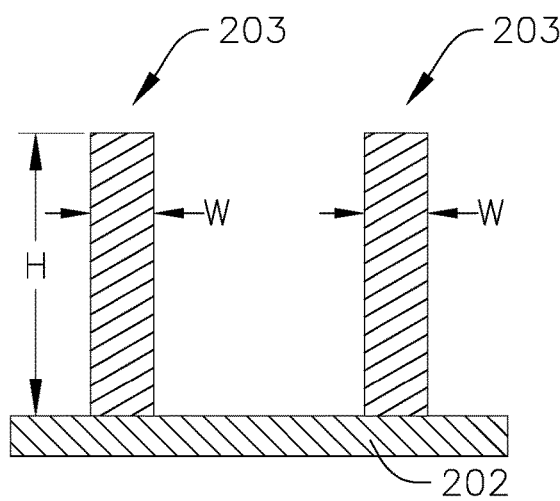
Figure 2D:
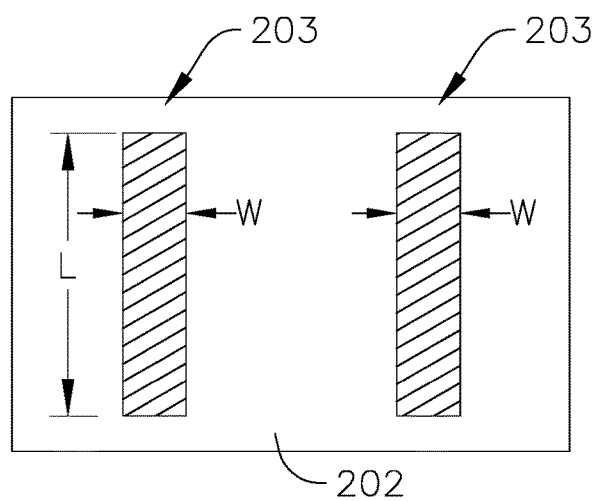
Figure 2E:
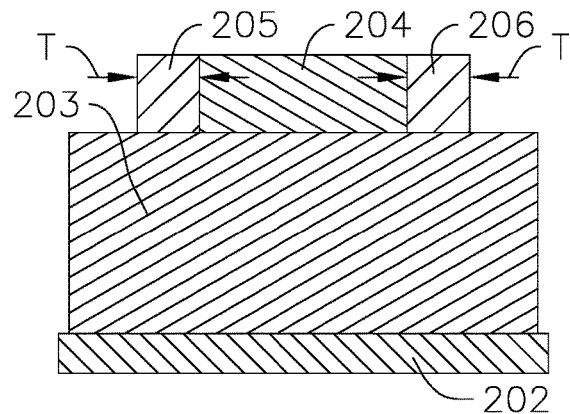
Figure 2F:
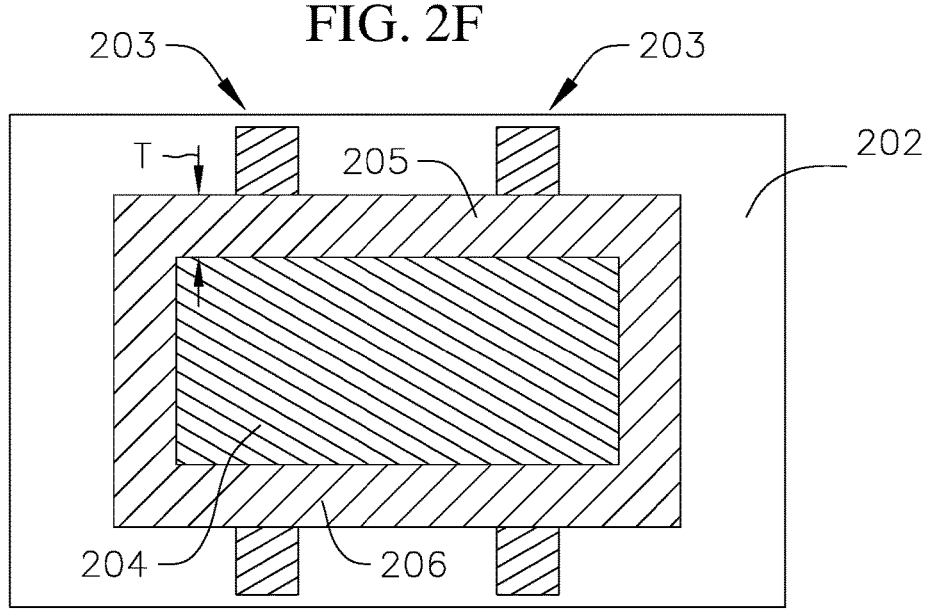
Figure 2G:
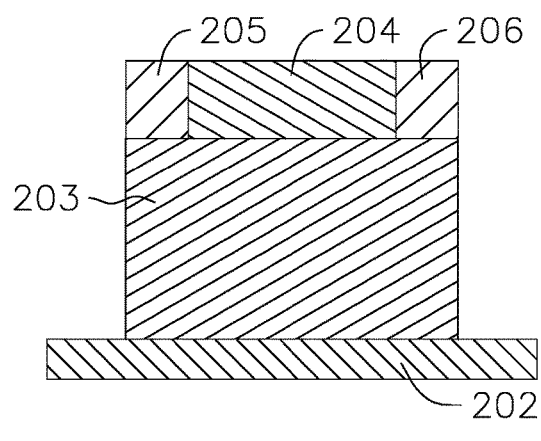
Figure 2H:
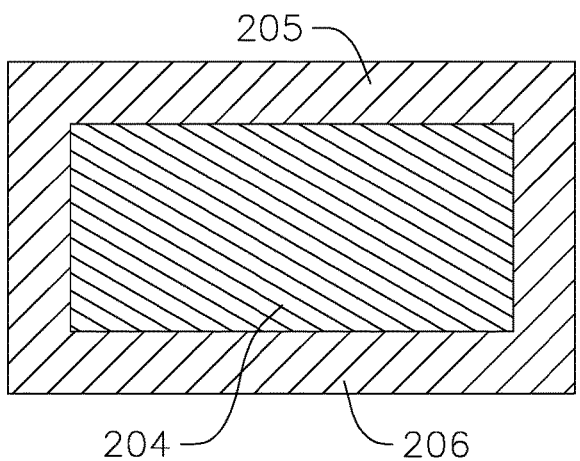
Figure 2I:
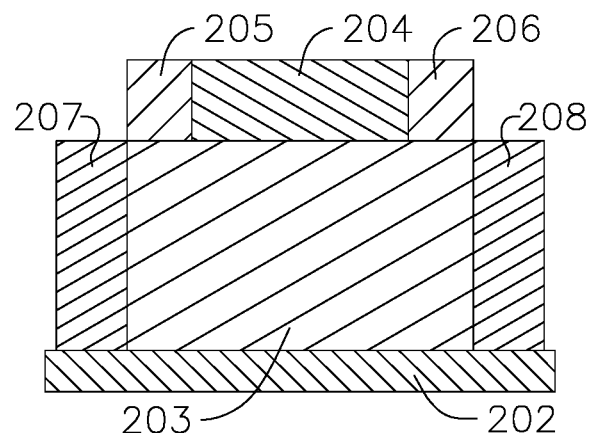
Figure 2J:
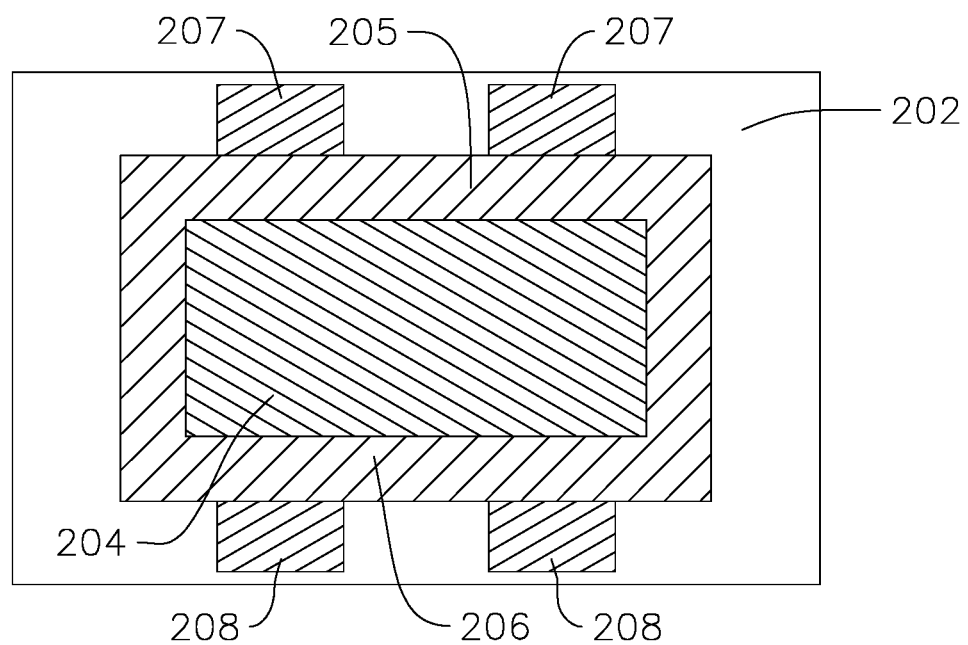
Figure 2K:
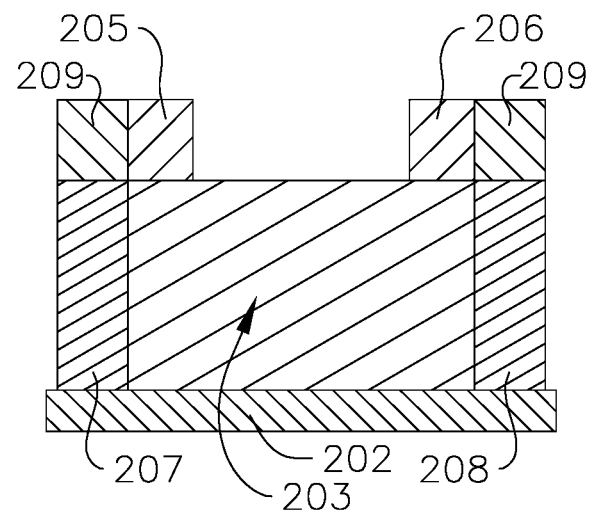
Figure 2L:
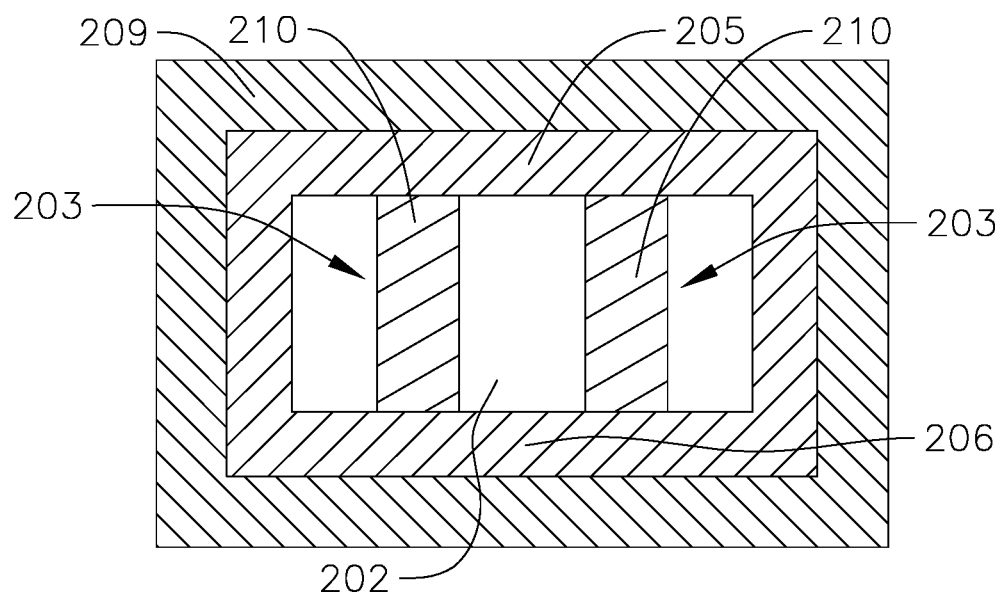
Figure 2M:
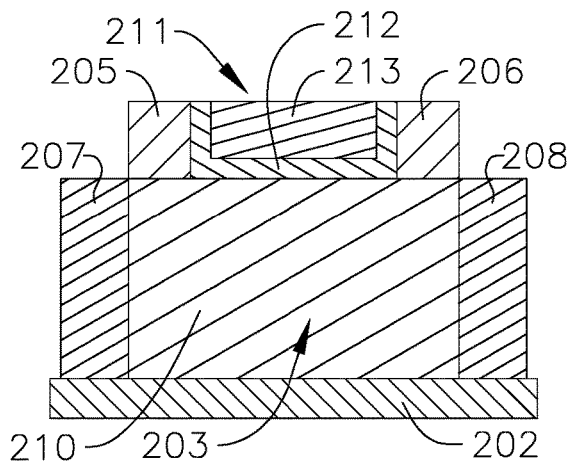
Figure 2N:
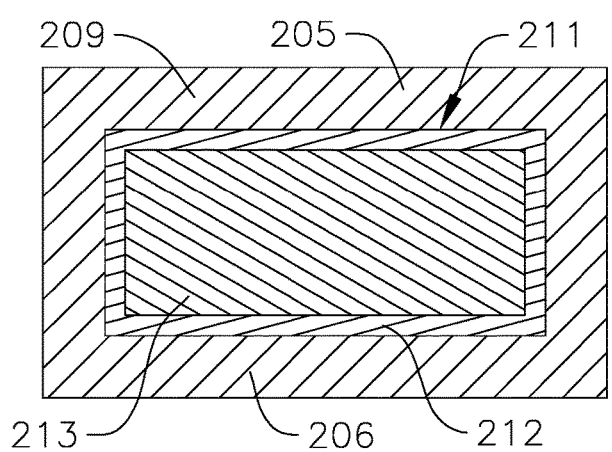
Figure 2O:
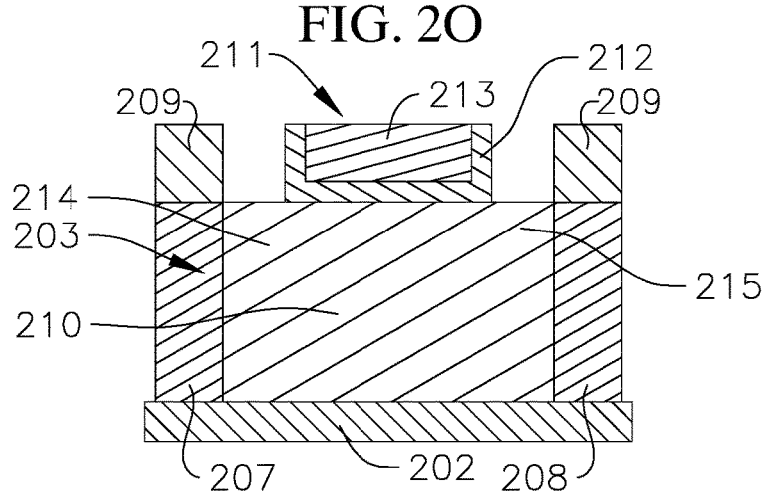
Figure 2P:
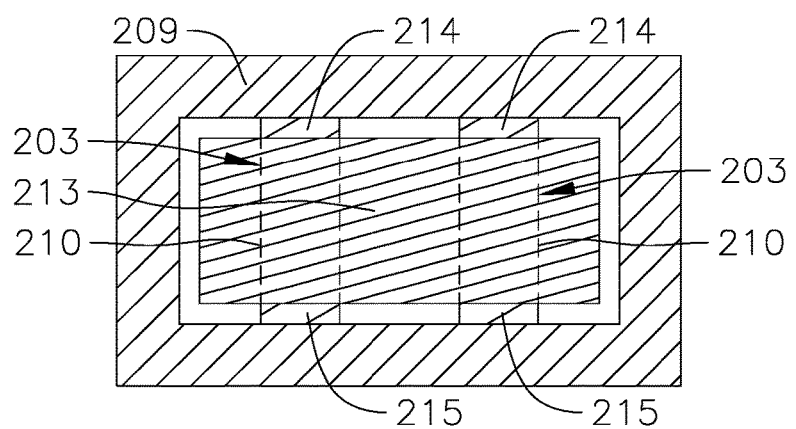
Figure 2Q:
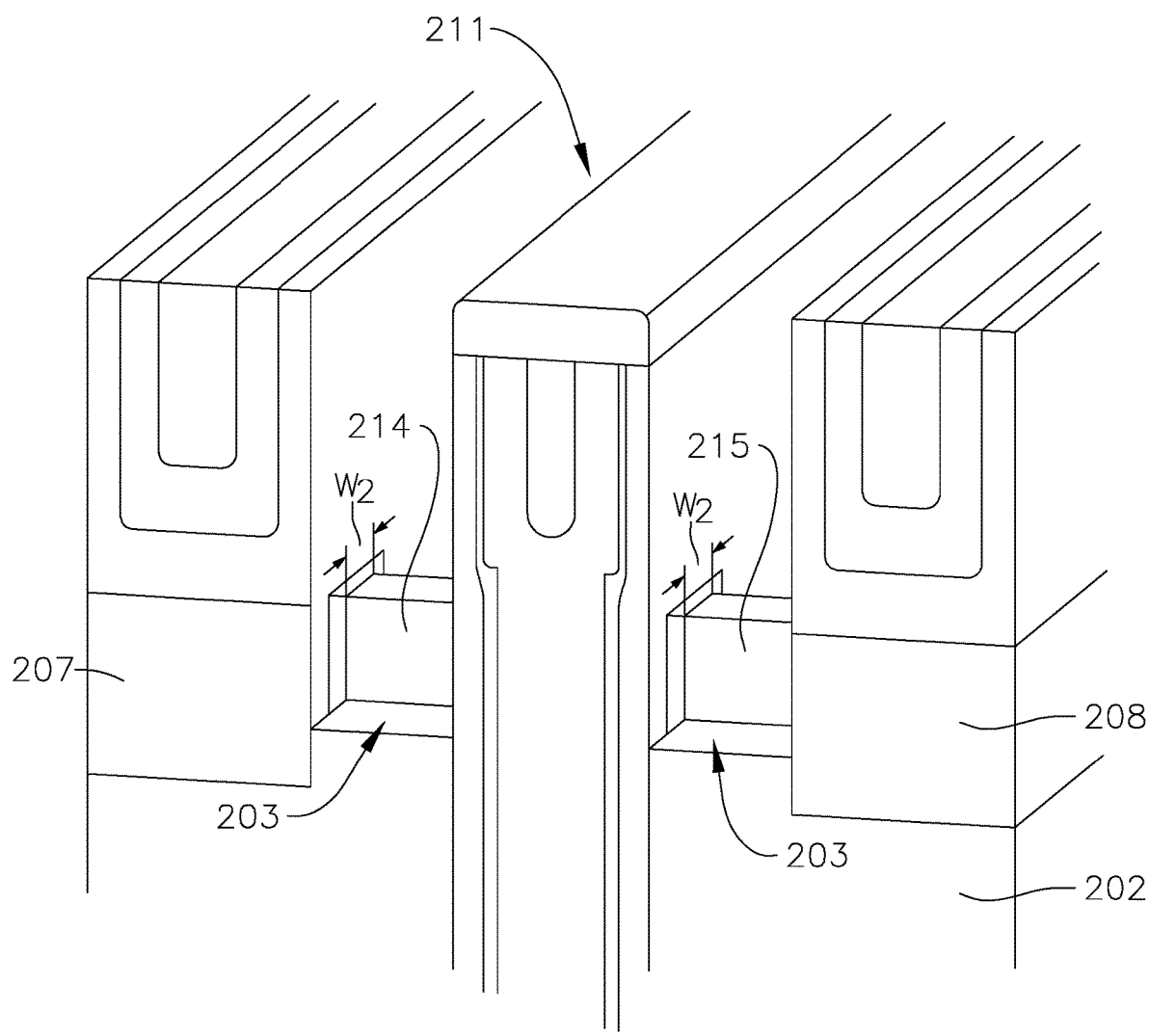
Figure 2R:
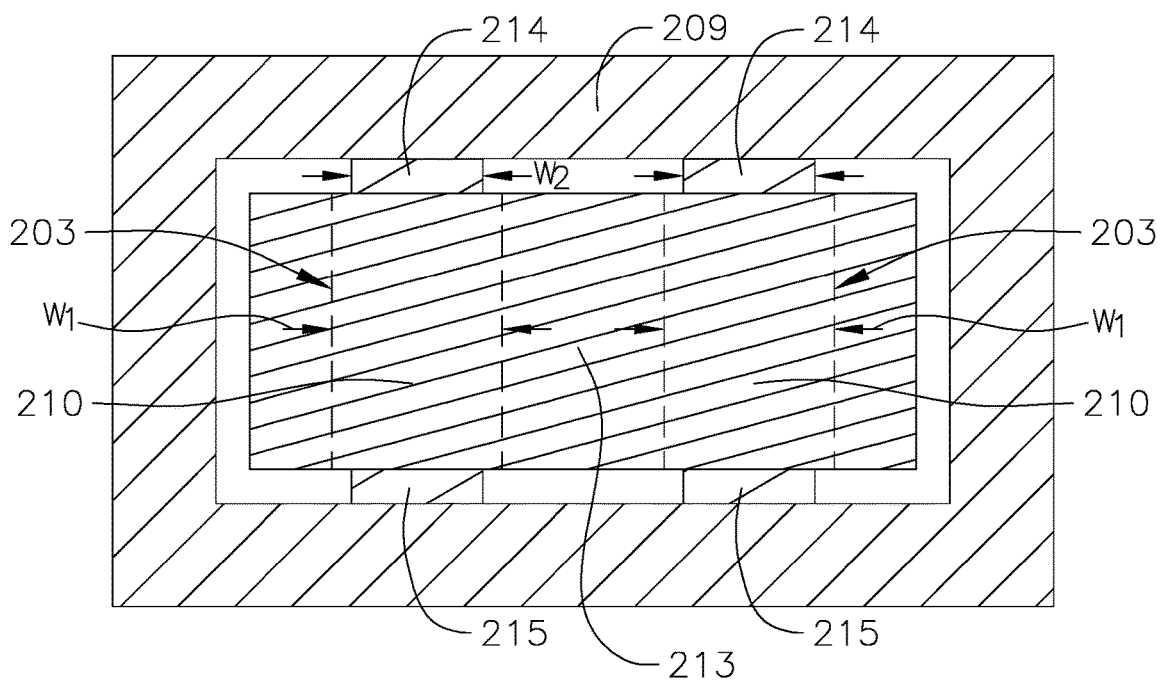
Figure 2S:
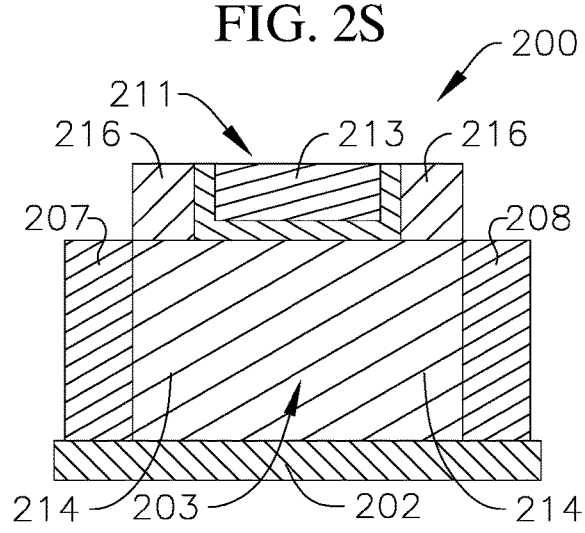
Figure 2T:
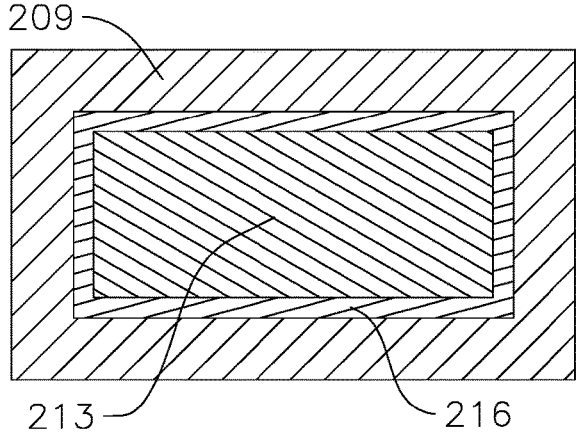

FIGS. 2A-2T depict tasks of a method of manufacturing a field effect transistor (FET) 200 according to one embodiment of the present disclosure. As illustrated in FIGS. 2A-2B, the method includes a task of depositing a conducting channel layer 201 on a silicon substrate 202. The silicon substrate 202 may include a (100) or (110) silicon (Si) substrate. In one or more embodiments, the conducting channel layer 201 is formed of Si. In one or more embodiments in which the FET 200 is an n-type FET, the material of the conducting channel layer 201 may be Group III-V materials, such as InGaAs. In one or more embodiments, the material of the conducting channel layer 201 may be Group IV materials, such as Ge, for either n-type FETs or p-type FETs. In one or more embodiments in which the FET 200 is a p-type FET, the material of the conducting channel layer 201 may be Group IV materials, such as SiGe. In one or more embodiments, the conducting channel layer 201 may be formed of SiGe, with Ge provided in an amount up to approximately 30%.

With reference now to FIGS. 2C-2D, the method according to one embodiment of the present disclosure includes a task of patterning and etching the conducting channel layer 201 to form at least one fin 203. The task of patterning and etching the conducting channel layer 201 to form the at least one fin 203 may be performed by any suitable process or technique, such as, for instance, lithography, sidewall-image transfer, or dry etching. In one or more embodiments, the task may include forming any desired number of fins 203, such as one fin, two fins, or three or more fins. The task of patterning and etching the conducting channel layer 201 includes forming the one or more fins 203 with the desired channel height H, the desired channel width W, the desired channel length L, and, in the case of two or more fins, forming the fins 203 with the desired horizontal separation distance between adjacent fins. In one or more embodiments, the task of forming the one or more fins 203 may include a single mask task and a single etch task or two or more mask and etch tasks. Additionally, in one or more embodiments, the task may be utilized to form one or more fins 203 for nFETs and/or pFETs. In one or more embodiments, the fin 203 may have a width W in a range from approximately 4 nm to approximately 7 nm (e.g., in a range from approximately 6 nm to approximately 7 nm) following the task of patterning and etching the conducting channel layer 201 to form the at least one fin 203.

With reference now to FIGS. 2E-2F, the method also includes a task of forming a dummy gate stack 204 (e.g., a dummy gate formed of oxide/poly-Si/nitride) and forming gate spacers 205, 206 by any process known in the art, such as nitride deposition, on opposite sides of the dummy gate stack 204. In one or more embodiments, the material of the gate spacers 205, 206 may be Silicon Oxide, Silicon Nitride, Silicon Carbon Oxide, Silicon Boron Carbon Nitride, Silicon Carbon Nitride, or combinations thereof. In one or more embodiments, each of the gate spacers 205, 206 may have a width T in a range from approximately 4 nm to approximately 15 nm. In one or more embodiments, the width T of the gate spacers 205, 206 may be equal or substantially equal to the lengths of extension regions of the fin 203. In one or more embodiments, the gate spacers 205, 206 may include a sacrificial dielectric layer.

As illustrated in FIGS. 2G-2H, the method also includes a task of masking source and drain regions and etching the one or more fins 203 in regions not protected by the dummy gate stack 204 and the gate spacers 205, 206 formed during the task described above with reference to FIGS. 2E-2F. In one or more embodiments, the etching of the one or more fins 203 proceeds all the way down to, or into, the silicon substrate 202.

With reference now to FIGS. 2I-2J, the method also includes a task of forming source and drain electrodes 207, 208 (e.g., nFET source and drain electrodes or pFET source and drain electrodes) by, for example, epitaxial deposition, on the silicon substrate 202 on opposite sides of each of the one or more fins 203. In one or more embodiments, the source and drain electrodes 207, 208 may be nFET source and drain regions formed from any suitable material, such as Si, SiP, or SiCP. In one or more embodiments, the nFET source and drain regions may be formed of Si having impurities, such as phosphorous (P) or carbon (C). In one or more embodiments, the task of forming the pFET source and drain electrodes includes depositing a buffer layer of Si having a thickness, for example, from approximately 1 nm to approximately 5 nm (e.g., approximately 1.5 nm), followed by depositing a layer of SiGe, SiGeB, or a similar material. In one or more embodiments, the task may include depositing a SiGe layer having impurities, such as boron (B) or tin (Sn).

With reference now to FIGS. 2K-2L, the method also includes tasks of depositing an interlayer dielectric (ILD) 209, performing chemical mechanical planarization (CMP) to a top of the dummy gate stack 204, and then removing the dummy gate stack 204 (e.g., by an etch) to expose a channel portion 210 of each of the one or more fins 203.

With reference now to FIGS. 2M-2N, the method also includes forming a gate stack 211 by forming a gate dielectric layer 212 and then forming a metal layer 213 on the gate dielectric layer 212 by any process or processes known in the art, such as atomic-layer deposition (ALD). During the task of forming the gate stack 211, the gate dielectric layer 212 and the metal layer 213 fill the region previously occupied by the dummy gate stack 204 (i.e., the gate stack 211 occupies a void formed during the task of removing the dummy gate stack 204).

With reference now to FIGS. 2O-2P the method also includes a task of removing at least a portion of the gate spacers 205, 206 to expose extension regions or portions 214, 215 of the fin 203 under the gate spacers 205, 206, respectively (e.g., etching at least a portion of each of the gate spacers 205, 206 to expose the extension portions 214, 215 of the fin 203 under the gate spacers 205, 206). The task of removing at least a portion of each of the gate spacers 205, 206 may include an etch process, such as, for instance, a wet etch process or a dry etch process.

With reference now to FIGS. 2Q-2R, the method also includes a task of thinning the exposed extension portions 214, 215 of the fin 203 (i.e., thinning the extension portions 214, 215 of the fin 203 that were under the gate spacers 205, 206 prior to the task of removing at least a portion of the gate spacers 205, 206). In one or more embodiments, the exposed extension portions 214, 215 of the fin 203 may be thinned uniformly, substantially uniformly, or non-uniformly. The tasks of removing the gate spacers 205, 206 and thinning the extension portions 214, 215 of the fin 203 may include an etch process, such as, for instance, a wet etch process or a dry etch process. The task of thinning the exposed extension portions 214, 215 of the fin 203 does not affect or substantially does not affect the width of the channel portion 210 of the fin 203 under the gate stack 211 (i.e., the task of thinning the exposed extension portions 214, 215 of the fin 203 does not affect the width of the channel portion 210 of the fin 203). Accordingly, following the task of thinning the extension portions 214, 215 of the fin 203, the extension portions 214, 215 have a width $W_2$ that is less than a width $W_1$ of the channel portion 210 of the fin 203 (i.e., the portion of the fin 203 under the gate stack 211). In one or more embodiments, the width $W_1$ of the channel portion 210 of the fin 203 is less than approximately 10 nm. In one or more embodiments, the width $W_2$ of the extension portions 214, 215 of the fin 203 is less than approximately 10 nm following the task of thinning the exposed extension portions 214, 215 of the fin 203. In one or more embodiments, the width $W_2$ of each of the exposed extension portions 214, 215 of the fin 203 is less than the width $W_1$ of the channel portion 210 of the fin 203 and in a range from approximately 2 nm to approximately 5 nm following the task of thinning the exposed extension portions 214, 215 of the fin 203. In one or more embodiments, the width $W_2$ of each of the extension portions 214, 215 is thinner than the width $W_1$ of the channel portion 210 of the fin 203 by approximately 2 nm to approximately 8 nm following the task of thinning the exposed extension portions 214, 215 of the fin 203 (i.e., the extension portions 214, 215 of the fin 203 exposed by the removal of the gate spacers 205, 206 are thinner than the channel portion 210 of the fin 203 under the gate stack 211 by approximately 2 nm to approximately 8 nm following the task of thinning the exposed extension portions 214, 215 of the fin 203).

In one or more embodiments, the method may also include a task of additional doping of the extension portions 214, 215 of the fin 203. The task of additional doping of the extension portions 214, 215 of the fin 203 is configured to further reduce the resistance of the extension portions 214, 215 of the fin 203. The task of additional doping of the extension portions 214, 215 of the fin 203 may be performed before or after the task of thinning the extension portions 214, 215. The task of additional doping may be performed with a Boron and Phosphorus family dopant. In one or more embodiments, the concentration of the additional dopant may be less than approximately 1E22 cm$^{-3}$, such as, for example, in range of approximately 1E18 cm$^{-3}$ to approximately 1E21 cm$^{-3}$. The task of additional doping may be performed by any suitable process known in the art, such as, for example, plasma doping, doped epitaxial deposition, or doped dielectric deposition. Additionally, in one or more embodiments, the method includes a task of doping activation following the task of additional doping of the extension portions 214, 215 to activate the additional dopant.

With reference now to FIGS. 2S-2T, the method also includes a task of depositing a dielectric material 216 in the regions of the removed gate spacers 205, 206 (e.g., depositing a dielectric material 216 surrounding the extension portions 214, 215 of the fin 203 that were thinned during the task of thinning the extension portions 214, 215) and then polishing the deposited dielectric material 216. The dielectric material 216 forms redeposited gate spacers on opposite sides of the gate stack 211. In one or more embodiments, the dielectric material 216 may include any suitable insulative material, such as, for example, Silicon Oxide, Silicon Nitride, Silicon Carbon Oxide, Silicon Boron Carbon Nitride, Silicon Carbon Nitride, or combinations thereof. In one or more embodiments, the dielectric material 216 may be air (e.g., the method may include forming airgap gate spacers).

The method also includes completing formation of the FET 200 and a chip including one or more of the FETs by tasks known in the art, including CMP tasks to enable gate metal only in the removed dummy gate regions, followed by a task of contact formation, and a task of back-end-of-line (BEOL) formation. Additionally, in one or more embodiments, the method may include forming partial gate-all-around (GAA) FETS, conventional full GAA FETs, and/or conventional finFETs on the same chip/circuit as the FET 200 formed according to the tasks of the present disclosure described above.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims.

What is claimed is:

1. A method of manufacturing a field effect transistor, the method comprising:
    forming a fin on a substrate, the fin comprising silicon;
    forming source and drain electrodes on opposite sides of the fin;
    forming a gate stack on a channel portion of the fin between the source and drain electrodes;
    forming gate spacers on extension portions of the fin on opposite sides of the gate stack;
    removing at least a portion of the gate spacers to expose the extension portions of the fin; and
    thinning the extension portions of the fin, wherein the channel portion of the fin has a first width and the extension portions of the fin have a second width less than the first width following the thinning of the extension portions of the fin.

2. The method of claim 1, wherein the thinning the extension portions comprises etching the extension portions of the fin with a wet etch or a dry etch.

3. The method of claim 1, further comprising depositing a dielectric material on the extension portions of the fin after the thinning of the extension portions of the fin.

4. The method of claim 3, wherein the dielectric material comprises an insulative material selected from the group consisting of Silicon Oxide, Silicon Nitride, Silicon Carbon Oxide, Silicon Boron Carbon Nitride, Silicon Carbon Nitride, air, and combinations thereof.

5. The method of claim 1, wherein the second width is in a range from approximately 2 nm to approximately 5 nm.

6. The method of claim 1, wherein the second width is less than the first width by an amount in a range from approximately 2 nm to approximately 8 nm.

7. The method of claim 1, further comprising additional doping of the extension portions of the fin.

8. The method of claim 7, wherein the additional doping is performed with a Boron and Phosphorous family dopant.

9. The method of claim 7, wherein the additional doping has a dopant concentration in range of approximately 1E18 cm$^{-3}$ to approximately 1E21 cm$^{-3}$.

10. A field effect transistor comprising:
    a fin comprising silicon;
    a source electrode and a drain electrode on opposite sides of the fin;
    a gate stack on a channel portion of the fin; and
    gate spacers on extension portions of the fin,
    wherein the channel portion of the fin has a first width and the extension portions of the fin have a second width less than the first width.

11. The field effect transistor of claim 10, wherein the second width is in a range from approximately 2 nm to approximately 5 nm.

12. The field effect transistor of claim 10, wherein the second width is thinner than the first width by an amount in a range from approximately 2 nm to approximately 8 nm.

13. The field effect transistor of claim 10, wherein the first width is in a range from approximately 6 nm to approximately 7 nm.

14. The field effect transistor of claim 10, wherein the gate spacers comprise an insulative material selected from the group consisting of Silicon Oxide, Silicon Nitride, Silicon Carbon Oxide, Silicon Boron Carbon Nitride, Silicon Carbon Nitride, air, and combinations thereof.

15. The field effect transistor of claim 10, wherein the fin comprises an n-type dopant or a p-type dopant.

16. A system on chip comprising:
   a first field effect transistor; and
   a second field effect transistor, wherein the first and second field effect transistors each comprise:
      a fin comprising silicon;
      a source electrode and a drain electrode on opposite sides of the fin;
      a gate stack on a channel portion of the fin; and
      gate spacers on extension portions of the fin,
         wherein the channel portion of the fin has a first width and the extension portions of the fin have a second width less than the first width.

17. The system on chip of claim 16, wherein the first field effect transistor is an nFET and the second field effect transistor is a pFET.

18. The system on chip of claim 16, wherein the second width of the first field effect transistor is different than the second width of the second field effect transistor.

19. The system on chip of claim 16, wherein the second width of the first field effect transistor is substantially the same as the second width of the second field effect transistor.

20. The system on chip of claim 16, wherein, for at least one of the first and second field effect transistors, the second width is in a range from approximately 2 nm to approximately 5 nm.

21. The system on chip of claim 16, wherein, for at least one of the first and second field effect transistors, the gate spacers comprise an insulative material selected from the group consisting of Silicon Oxide, Silicon Nitride, Silicon Carbon Oxide, Silicon Boron Carbon Nitride, Silicon Carbon Nitride, air, and combinations thereof.

* * * * *